United States Patent

Schultz et al.

[11] Patent Number: 6,122,707
[45] Date of Patent: Sep. 19, 2000

[54] CONTENT ADDRESSABLE MEMORY SYSTEM WITH SELF-TIMED SIGNALS AND CASCADED MEMORIES FOR PROPAGATING HIT SIGNALS

[75] Inventors: Kenneth James Schultz, Kanata; Farhad Shafai; Garnet Frederick Randal Gibson, both of Nepean, all of Canada

[73] Assignee: Nortel Networks Corporation, Montreal, Canada

[21] Appl. No.: 08/923,633

[22] Filed: Sep. 4, 1997

[51] Int. Cl.$^7$ .......................... G06F 13/00; G11C 15/00
[52] U.S. Cl. ................................. 711/108; 365/49
[58] Field of Search .................... 711/108, 5; 365/49, 365/210, 230.03; 713/400, 503

[56] References Cited

U.S. PATENT DOCUMENTS

| | | | |
|---|---|---|---|
| 4,670,858 | 6/1987 | Almy | 365/49 |
| 5,031,141 | 7/1991 | Guddat et al. | 365/49 |
| 5,034,919 | 7/1991 | Sasai et al. | 365/49 |
| 5,289,403 | 2/1994 | Yetter | 365/49 |
| 5,440,715 | 8/1995 | Wyland | 711/108 |
| 5,517,441 | 5/1996 | Dietz et al. | 365/49 |
| 5,555,397 | 9/1996 | Sasama et al. | 711/108 |
| 5,568,416 | 10/1996 | Kawana et al. | 365/49 |
| 5,828,593 | 10/1998 | Schultz et al. | 365/49 |
| 5,859,791 | 1/1999 | Schultz et al. | 365/49 |

FOREIGN PATENT DOCUMENTS 0 551 214   7/1993   European Pat. Off. .

OTHER PUBLICATIONS

"A 288–kb Fully Parallel Content Addressable Memory Using a Stacked–Capacitor Cell Structure", T. Yamagata et al., IEEE Journal of Solid–State Circuits, vol. 27, No. 12, Dec. 1, 1992, pp. 1927–1933.
"Self–Timed Hit Circuit for a Content Addressable Memory", IBM Technical Disclosure Bulletin, vol. 38, No. 2, Feb. 1, 1995, pp. 65/66.

*Primary Examiner*—Glenn Gossage

[57] ABSTRACT

A system includes a plurality of content addressable memory (CAM) arrays and a plurality of logic circuits. The logic circuits are connected to a commonly shared bus. Each of the logic circuits is associated with the respective CAM array. Each of the CAM arrays provides search results (hit, match address and multiple match) in a search operation in response to a clock signal. The hit signals provided from the CAM arrays to the respective logic circuits. Each logic circuit provides an OR logic output signal from a hit signal input from an upstream logic circuit and the hit signal provided by the CAM array associated with that logic circuit, in response to a self-timed signal which is delayed in time from the clock signal. The OR logic output signal provided by the logic circuit is provided to a downstream logic circuit. Thus, the furthest downstream logic circuit provides a hit result of the system in a search operation.

4 Claims, 3 Drawing Sheets

CONTENT ADDRESSABLE MEMORY SYSTEM WITH SELF-TIMED SIGNALS AND CASCADED MEMORIES FOR PROPAGATING HIT SIGNALS

TECHNICAL FIELD

The present invention relates to a content addressable memory (CAM) system in which a plurality of CAM arrays are cascaded.

BACKGROUND INFORMATION

Content addressable memories (CAMs) are known. In CAMs, data is selected based on contents, rather than physical location. This function is useful for many applications, especially when performing a look-up for the purposes of mapping. This operation is required in many telecommunications (telecomm) functions, including Asynchronous Transfer Mode (ATM) address translation.

Often, system storage requirements exceed the number of entries stored on a single CAM array. Multiple CAM arrays, possibly on multiple chips, are then required, and it is necessary to cascade the multiple CAM arrays such that they may be searched as a single entity. An appropriate "user-friendly" cascading capability enables the same CAM array to be used in a range of systems with different capacity requirements, and allows for easy expandability and scalability, as well.

U.S. Pat. No. 5,568,416 granted to K. Kawana et al on Oct. 22, 1996 discloses an associative memory in which multiple CAM chips are cascaded by propagating a result address and status through all chips in the cascade. Each chip contains a status register for itself, and another for all upstream chips. It also discloses means of identifying the last device in the cascade, and separate storage areas for common and unique data entries.

SUMMARY OF THE INVENTION

It is an object of the present invention to provide an improved content addressable memory system.

According to one aspect of the present invention, there is provided a system comprising: a plurality of content addressable memory (CAM) arrays, each CAM array comprising encoding means and an array of core cells, of w words×b bits, associated with the encoding means, each CAM array being able to provide, through its respective encoding means, a hit signal resulting from a search operation in response to a clock signal; and a plurality of logic circuits, each logic circuit being associated with the respective CAM array to receive the hit signal therefrom, each logic circuit comprising timing signal generation means for generating a self-timed signal in response to the clock signal, each logic circuit comprising logic means for logically combining a propagation-in hit signal provided from an upstream logic circuit and the hit signal provided from the associated CAM array, so that a propagation-out hit signal is provided to a downstream logic circuit, in response to the self-timed signal.

According to the present invention, it is possible to implement a plurality of CAM arrays that has the same kind of search result outputs as a single CAM (e.g., hit, match address). It is thus possible that n CAM arrays, each with a capacity of w entries (or words), are integrated into a single multi-chip CAM system with n×w words. In the system, a hit signal is propagated from array to array.

The cascading means may comprise a plurality of propagating means, each being associated with the respective CAM array. In the system, a hit result is propagated from array to array.

BRIEF DESCRIPTION OF THE DRAWINGS

An embodiment of the present invention will now be described by way of example with reference to the accompanying drawings in which.

DETAILED DESCRIPTION

Figure 1:
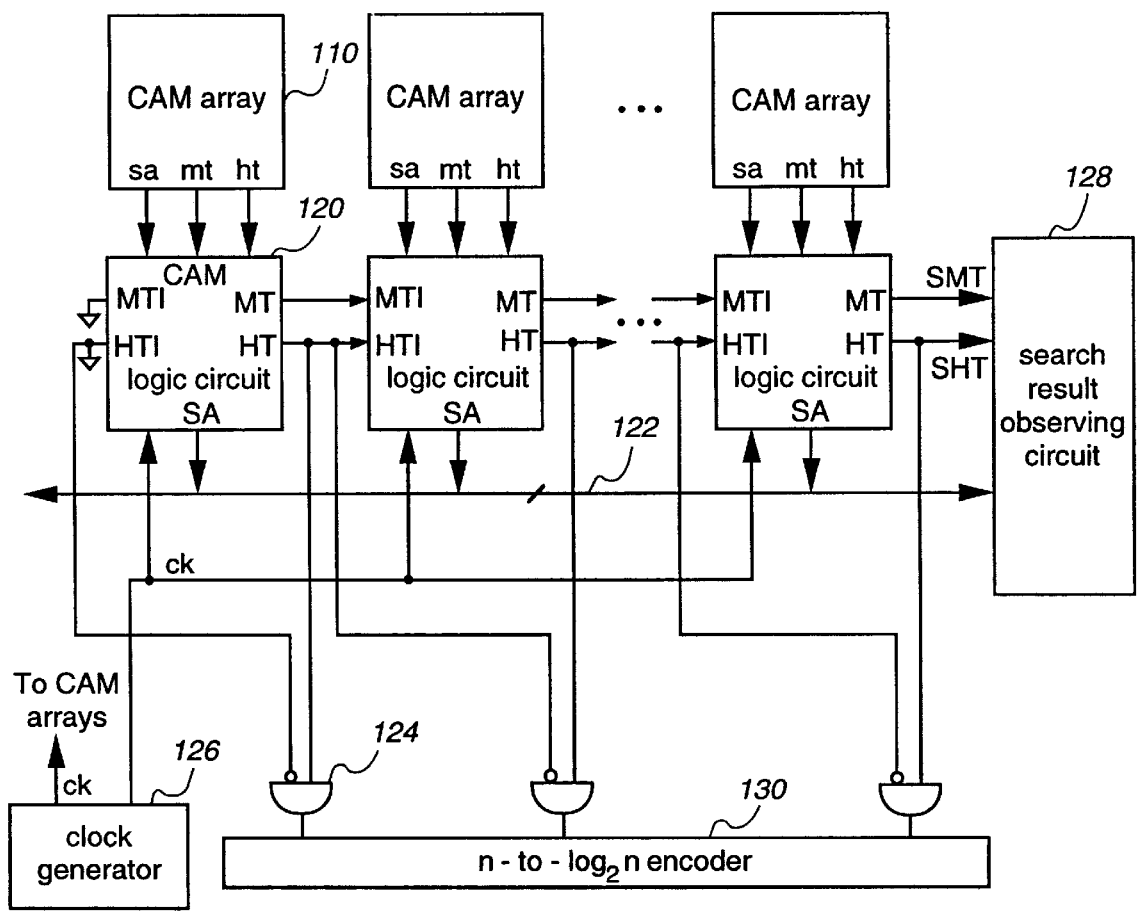
FIG. 1 is a block diagram of a system including a plurality of CAM arrays which are cascaded, according to an embodiment of the present invention.

Referring to FIG. 1 which shows a system according to an embodiment of the present invention, the system includes n CALM arrays 110 which are cascaded through n logic circuits 120. Each logic circuit 120 is associated with the respective CAM array 110 to receive hit, match address and multiple match signals ht, sa and mt therefrom;

the timing of these three signals is known but not necessarily controllable. The logic circuit 120 has input terminals HTI and MTI for receiving hit and multiple match signals, respectively, from the upstream logic circuit 120. Both input terminals MTI and HTI of the furthest upstream logic circuit 120 are connected to logic 0 terminals. Also, each logic circuit 120 has output terminals HT and MT for providing hit and multiple match signals to the downstream logic circuit 120. An address output terminal SA of each logic circuit 120 is connected to a commonly shared bus 122. The system includes n AND gates 124 which have inverting and non-inverting input terminals.

The hit input terminal HTI and hit output terminal HT of each logic circuit 120 are connected to the inverting and non-inverting input terminals of the respective AND gate 124. A clock generator 126 provides clock signals ck to the CAM arrays 110 and the logic circuits 120. The bus 122 and the hit and multiple match output terminals HT and MT of the furthest downstream logic circuit 120 are connected to a search result observing circuit 128. The output terminals of the AND gates 124 are connected to an n-to-$\log_2 n$ encoder 130.

Figure 2:
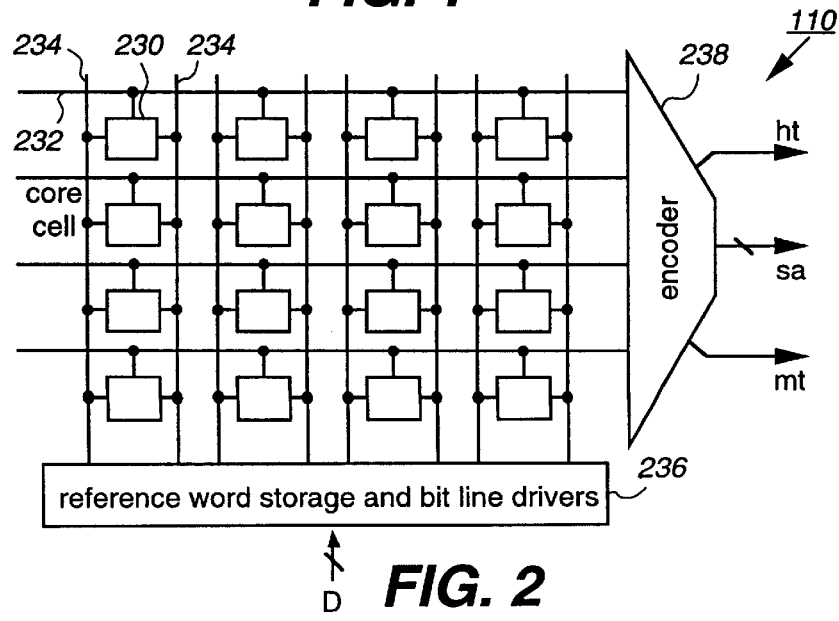
FIG. 2 is a circuit diagram of an example of a CAM array shown in FIG. 1.

Referring to FIG. 2 which shows an example of the CAM array 110 implemented with an array of w (=4) words (rows)×b (=4) bits (columns), the CAM array 110 includes core cells 230 of w row×b columns. Each of the core cells 230 includes data storage means (not shown) and is at the intersection of a match line 232 and a pair of bit lines 234. A pair of bit lines 234 carry differential data representing a single bit, rather than two bits of data. Each core cell 230 acts to store a single bit of data and is capable of performing a single-bit comparison (logical exclusive NOR (XNOR)) operation, in addition to its bit storage capability. The bit lines 234 for differential data are connected to reference word storage and bit line drivers 236 which receive input data D for loading the contents of the CAM array and for the search reference word. The CAM array 110 includes an encoder 238 which is connected to the match lines 234. The structure of the CAM array is known. See a paper by K. J. Schultz et al. entitled "Architectures for Large-Capacity CAMs", INTEGRATION: the VLSI Journal, Vol. 18, pp. 151–171, 1995, which is incorporated herein by reference.

The CAM array is not limited to one shown in FIG. 2. There are many variations. For example, the data comparison function of a CAM array may not be performed by the core cells, but is performed by separate comparators placed adjacent to the core cells. Such a CAM array is described in U.S. patent application Ser. No. 08/748,928 entitled "Large-Capacity Content Addressable Memory", filed on Nov. 14, 1996 by K. J. Schultz et al, U.S. Pat. No. 5,828,593 which is incorporated herein by reference. Also, a core cell array of a CAM array may be chained as described in U.S. patent application Ser. No. 09/923,823 entitled "Content Addressable Memory", filed on Sep. 4, 1997 by K. J. Schultz et al, now U.S. Pat. No. 5,859,791, which is incorporated herein by reference.

Referring to FIGS. 1 and 2, in response to the clock signal ck, when differential data is asserted on a pair of bit lines 234 in a search operation, the core cell 230 compares its stored data bit with this differential data (also known as reference data, or a single bit of the comparand). When the stored data is not equal to the reference data, the core cell 230 pulls the match line 232 (which is precharged to a logical high state) down to a low state. When the stored data is equal to the reference data, the cell 230 has no effect on the match line 232 to which it is connected. Because all b core cells 230 in a given word are connected to the match line 232 in the same way, the match line 232 will be pulled low if any bit in its word is unequal to (or mismatches) the corresponding reference bit. The match line 232 remains in a logical high state only if all bits in its word match their corresponding reference bits.

Each CAM array 110 is able to provide search results (i.e., hit, match address and multiple match signals ht, sa and mt), via the encoder 238, which are fed to the respective logic circuit 120. Each logic circuit 120 propagates the hit and multiple match results array-to-array and transfers the match address result to the commonly shared bus 122. The hit and multiple match results SHT and SMT of the system are available at the far right side (the furthest downstream). An additional useful piece of status information is the ordinal location of the array that has driven its result onto the bus 122 (i.e., the highest-priority array with a match); this information is generated by the AND gate 124 and the encoder 130.

Figure 3:
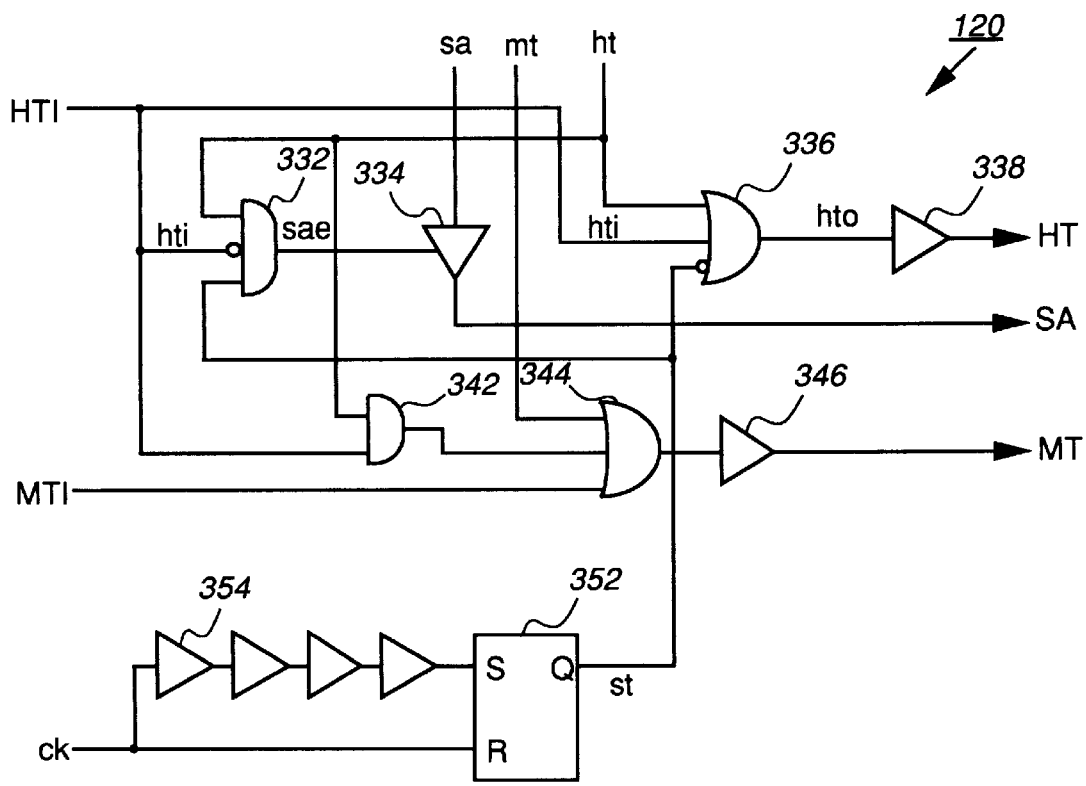
FIG. 3 is a circuit diagram of an example of a logic circuit shown in FIG. 1.

With reference to a single array 110, the binary address of a matching word is encoded onto the "sa" output. In the event that a plurality of words have matched the reference data, the multiple match signal mt is asserted to a logical high state. In this event, the match address output of the encoder 238 may produce (a) an invalid result, (b) an address representing the location of a single one of the multiple matches, or (c) a sequence of outputs, representing the locations of each of the matched words. Note that some applications may not require the multiple match result, and all references to the multiple match function may be eliminated from this disclosure, without loss of utility FIG. 3 is a circuit diagram of an example of the logic circuit 120. Because the CAM array 110 of the system shown in FIG. 1 provides the hit and multiple match search results, the logic circuit 120 propagates them in a similar way. One logic circuit 120 receives hit, match address and multiple match signals ht, sa and mt of a search result from the respective CAM array 110. The hit signal ht is fed to AND gates 332 and 342 and an OR gate 336 The match address signal sa is fed to the input terminal of a transfer gate 334, the output terminal of which is connected to the match address output terminal SA of the logic circuit 120. The multiple match signal mt is fed to an OR gate 344. The propagation-in hit signal hti is fed to the AND gate 342, the OR gate 336 and the inverting input terminal of the AND gate 332, the output (a match address enable signal sae) of which is fed to the transfer gate 334. The multiple match input terminal MTI is connected to the OR gate 344. The output of the AND gate 342 is fed to the OR gate 344. The output of the OR gate 344 is fed to a buffer 346, the output terminal of which is connected to the multiple match output terminal MT of the logic circuit 120.

A self-timed signal st is generated by a self-timed signal generator. There are many possible embodiments of self-timed signal generators. It is the intended scope of this invention to subsume any such embodiment, provided the resulting self-timed signal st is employed as described above to enable contention-free result bus sharing.

Referring to FIG. 3, in one possible embodiment of a self-signal generator, the clock signal ck is fed to the reset input terminal R of the flip-flop 352. Also, the clock signal ck is fed to the set input terminal S of the flip-flop 352 through the buffers 354. The self-timed signal st is provided from the Q output terminal of the flip-flop 352 to the AND gate 332 and the inverting input terminal of the OR gate 336. The falling edge of the self-timed signal st is generated by the rising edge of the clock signal ck, while the rising edge of the self-timed signal st is generated by a delayed version of the rising edge of the clock signal ck. Timing both edges of the self-timed signal st from the rising edge of the clock signal ck results in duty cycle independence. The delay of the delay chain can be set equivalent to the delay between the rising edges of the clock signal ck and the hit signal ht. Alternatively, if the duty cycle of the clock signal ck is known and well controlled, timing of the rising edge of the self-timed signal st may be controlled by the falling edge of the clock signal ck. Note that hit timing should be predictable, in order to achieve maximum operating speed using the embodiment; in embodiments where the hit timing is not predictable, the width of the st low pulse must be sufficient to be longer than any possible ht delay.

Figure 4:
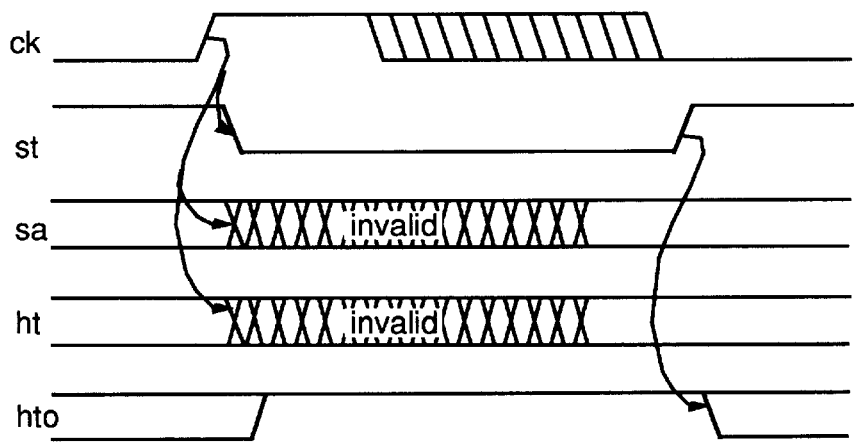
FIG. 4 is a timing chart showing self-timed signal and search results in one CAM array.
Figure 5A:
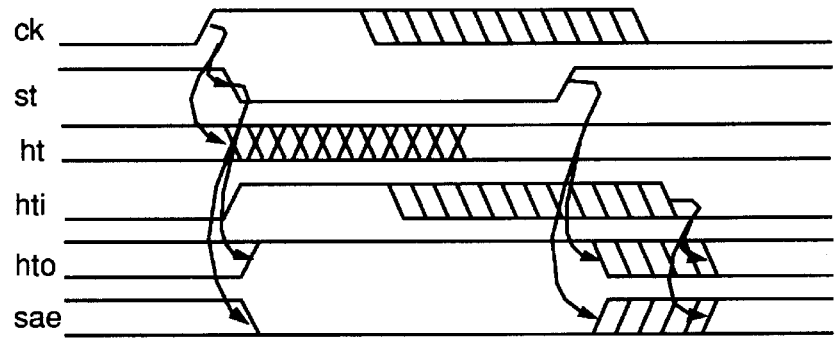
FIG. 5A is a timing chart showing relative timing of search signals responsive to the 0-1-0 transition of a propagation-in hit signal.
Figure 5B:
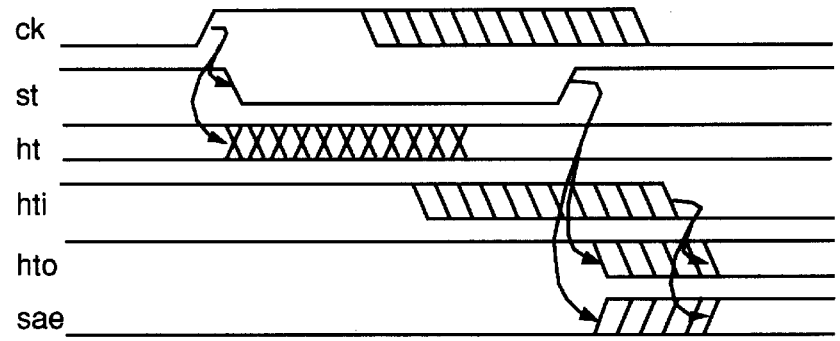
FIG. 5B is a timing chart showing relative timing of search signals responsive to the transition from 1 to 0 of the propagation-in hit signal.
Figure 5C:
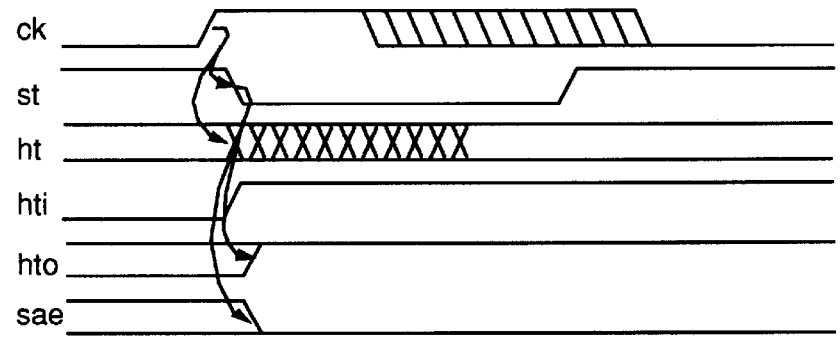
FIG. 5C is a timing chart showing relative timing of search signals responsive to the transition from 0 to 1 of the propagation-in hit signal.
Figure 5D:
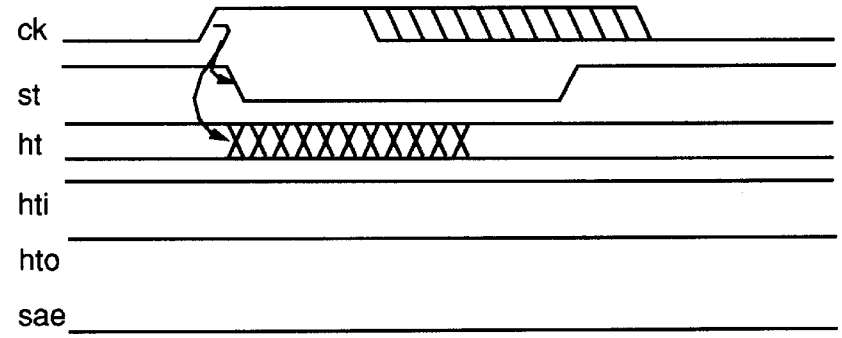
FIG. 5D is a timing chart showing relative timing of search signals responsive to the logic level of a propagation-in hit signal.

FIG. 4 is a timing chart showing self-timed signal and search results. An address signal sa from the CAM array 110 is fed to the transfer gate 334 which prevents the address signal from passing through the gate when the enable signal sae is low. An output signal from the transfer gate 334 is provided to the address output terminal SA. A propagation-out hit signal hto from the OR gate 336 is fed to the buffer 338.

During the time interval when st=0 on all logic circuits 120 in the system, no arrays are enabled to drive the bus 122.

During the same interval, although the hit signal ht is logic 1, due st=0, the transfer of the match address signal sa by the transfer gate 334 is disabled in the cascade are at logic 1, due to st=0 (see FIGS. 5A–D), doubly disabling SA output drivers through the propagation-in hit signal hti. This partial redundancy may be removed by re-timing the signals and decreasing the number of inputs to the gates, without departing from the scope of this invention. Note that such an approach would lead to a less robust design.

Waveforms of all of the relevant signals on a single array are shown in FIGS. 5A–5D, for the four different cases of the propagation-in hit signal hti (0-1-0 transition, 1-0 transition, 0-1 transition, and 1 logic level) 1 to 0, 0 to 1, and 1 to 1).

As can be seen, correct operation is independent of (a) speed differences between arrays and (b) routing delay, because de-selection occurs based on logic local to the circuit 120, and only selection is gated by upstream signals. This feature also supports expandability, as additional arrays added to a system may be subject to different processing conditions, or even a completely different fabrication technology.

When worst-case timing is characterized, the slowest path to SA driving will be from the propagation-in hit signal at the terminal HTI. The downward transition on the propagation-in hit signal at the terminal HTI may further propagate to the propagation-out hit signal at the terminal HT (assuming ht=0), such that the worst-case system performance is equal to that of a single array standing alone, plus (n–2) times the propagation-in hit signal to-HT delay plus the propagation-in signal to-SA delay. System performance can be characterized by the following expressions:

$$tCH-SAV=tCH-HITV+(n-2)\times tHITIL-HITL+tHITIL-SAV$$

$$tCH-SHTV=tCH-HTV+(n-1)\times tHTIL-tHTL$$

All timing parameters correspond to signals in FIGS. 1,3,4 and 5A–D.

tCH–SAV=time from upward transition on the clock signal ck to valid SA tCH–HTV=time from upward transition on the clock signal ck to HT valid for a single chip in isolation tHTIL–HTL=time from downward transition of HTI at a chip input to downward transition of HT at the same chip's output tHTIL–SAV=time from downward transition of HTI at a chip input to valid SA driven out from the same chip tCH–SHTV=time from an upward transition on the clock signal ck to valid SHT.

Note that, without the self-timed signal st, disabling and enabling SA drive would be dependent on HTI timing. Bus contention would be difficult to prevent, and disable timing would depend on an array's position in the cascade.

In another alternative embodiment, or simply an additional function, search address results may be stored in registers (not shown). The output of the encoder 130 may be used to determine which array's result register is read.

It is understood that there are many possible variations in embodiment detail that are logically subsumed by this invention disclosure, including different signal polarities, equivalent Boolean gate-level implementations, small timing variations, and so on.

What is claimed is:

1. A system comprising:

a plurality of content addressable memory (CAM) arrays, each CAM array comprising encoding means and an array of core cells, of w words×b bits, associated with the encoding means, each CAM array being able to provide, through its respective encoding means, a hit signal resulting from a search operation in response to a clock signal; and a plurality of logic circuits, each logic circuit being associated with the respective CAM array to receive the hit signal therefrom, each logic circuit comprising timing signal generation means for generating a self-timed signal in response to the clock signal, each logic circuit comprising logic means for logically combining a propagation-in hit signal provided from an upstream logic circuit and the hit signal provided from the associated CAM array, so that a propagation-out hit signal is provided to a downstream logic circuit, in response to the self-timed signal.

2. The system of claim 1, wherein the timing signal generation means comprises delay means for generating the self-timed signal with a time delay from the clock signal.

3. The system of claim 1, wherein the logic means comprises OR means for obtaining an OR logic signal of the self-timed signal, the propagation-in hit signal from the upstream logic circuit and the hit signal provided from the associated CAM array, so as to provide the propagation-out hit signal to the downstream logic circuit.

4. The system of claim 3, wherein the OR means comprises an OR gate for receiving an inverted signal of the self-timed signal, the propagation-in hit signal and the hit signal.

* * * * *